United States Patent
Fujikura

(10) Patent No.: US 8,026,523 B2
(45) Date of Patent: Sep. 27, 2011

(54) NITRIDE SEMICONDUCTOR FREE-STANDING SUBSTRATE AND DEVICE USING THE SAME

(75) Inventor: Hajime Fujikura, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 199 days.

(21) Appl. No.: 12/285,799

(22) Filed: Oct. 14, 2008

(65) Prior Publication Data
US 2009/0114943 A1    May 7, 2009

(30) Foreign Application Priority Data
Oct. 29, 2007    (JP) .................... 2007-280595

(51) Int. Cl.
*H01L 29/15*    (2006.01)
(52) U.S. Cl. ... 257/77; 257/103; 257/620; 257/E21.524; 257/E21.526
(58) Field of Classification Search .............. 257/77, 257/620, E21.524, E21.526, 103
See application file for complete search history.

(56) References Cited

U.S. PATENT DOCUMENTS

| | | | | |
|---|---|---|---|---|
| 2002/0027933 A1* | 3/2002 | Tanabe et al. | ................. | 372/45 |
| 2002/0105266 A1* | 8/2002 | Juestel et al. | ................. | 313/512 |
| 2007/0218703 A1* | 9/2007 | Kaeding et al. | ................. | 438/775 |
| 2007/0290228 A1* | 12/2007 | Yoshida | ................. | 257/190 |
| 2008/0056984 A1* | 3/2008 | Yoshioka et al. | ................. | 423/622 |

FOREIGN PATENT DOCUMENTS

| | | |
|---|---|---|
| JP | 11-233391 | 8/1999 |
| JP | 2002-16000 | 1/2002 |

OTHER PUBLICATIONS

X.Q. Shen and H. Okumura, "Surface step morphologies of GaN films grown on vicinal sapphire (0001) substrates by rf-MBE", Journal of Crystal Growth, 300 (2007) pp. 75-78.

* cited by examiner

*Primary Examiner* — Wael Fahmy
*Assistant Examiner* — John C Ingham
(74) *Attorney, Agent, or Firm* — McGinn IP Law Group, PLLC

(57) ABSTRACT

A nitride semiconductor free-standing substrate includes a surface inclined in a range of 0.03° to 1.0° from a C-plane, and an off-orientation that an angle defined between a C-axis and a tangent at each point on a whole surface of the substrate becomes maximum is displaced in a range of 0.5° to 16° from a particular M-axis orientation of six-fold symmetry M-axis orientations. The substrate does not include a region of $-0.5°<\phi<+0.5°$ on the surface, where $\phi$ represents a displacement angle of the off-orientation on a surface of the substrate from the particular M-axis orientation.

15 Claims, 3 Drawing Sheets

NITRIDE SEMICONDUCTOR FREE-STANDING SUBSTRATE AND DEVICE USING THE SAME

The present application is based on Japanese Patent Application No. 2007-280595 filed on Oct. 29, 2007, the entire contents of which are incorporated herein by reference.

BACKGROUND OF THE INVENTION

1. Field of the Invention

The present invention relates to a nitride semiconductor free-standing substrate and a device using the same and, in particular, to a nitride semiconductor free-standing substrate having a surface inclined at a predetermined angle to a C-plane and a device manufactured using the same.

2. Related Art

A nitride semiconductor has attracted attention as a blue, green and ultraviolet light-emitting device material or a high-output electronic device material.

As for a nitride semiconductor of which device application has been reported, almost all of them are conventionally realized, for example, by growing a nitride semiconductor on a hetero-substrate such as a sapphire, 4H—SiC or the like via a low temperature GaN or AlN buffer or a high temperature AlN buffer.

The surface of these substrates is generally inclined at about 0.1° to 10° to C-plane ((0001) plane). Since molecular steps (hereinafter referred to as simply "step") are regularly arranged on the surface by inclining the substrate surface to the C-plane, atoms supplied onto the substrate surface are likely to be incorporated into the steps when growing a nitride semiconductor crystal on the substrate, which results in so-called step-flow mode growth, and a good quality crystal with few defects can be obtained.

As an off-orientation of such substrates, namely, an orientation in which an angle between a C-axis and a tangent on the surface becomes maximum, an M-axis orientation or an A-axis orientation is generally selected. These orientations can provide a high symmetry (i.e., atoms uniformly arranged) for the crystal and, therefore, they are selected to have steps with high linearity.

In order to achieve the above step-flow mode growth, a SiC substrate has been suggested which has a surface inclining in the range of 0.02° to 0.6° to a (0001) plane of the SiC crystal and having an inclination orientation within 7° from an M-axis orientation (See, e.g., JP-A-11-233391).

Furthermore, a GaN substrate has been suggested which has a surface inclining in the range of 1° to 20° to a (0001) plane of the GaN crystal and having an inclination orientation within 7° from an A-axis orientation (See, e.g., JP-A-2002-16000).

However, a practical device using the conventional substrate with the inclined surface and having a nitride semiconductor layer formed on the substrate still has various drawbacks as below which may narrow the application range of a nitride semiconductor device.

For example, a nitride semiconductor light-emitting diode currently in practical use causes a low color purity, i.e., a large half-value width in emission spectrum. Although this may not be always problematic for use in display, it will be very problematic for use in, e.g., a backlight of a liquid crystal display. Namely, in a liquid crystal display using a light-emitting diode, light emitted from the light-emitting diode is directed on its screen while being passed through an optical filter, so that light beyond the pass band of the optical filter is wasted by being blocked by the optical filter, which causes an increase in power consumption when intending to provide a necessary brightness for the screen.

Also in case of a nitride semiconductor laser diode, due to the inferior color purity of a light-emitting layer, threshold current for laser oscillation must be increased.

In a nitride semiconductor electronic device such as a high-electron-mobility transistor (HEMT), a phenomenon called "current collapse" occurs in which amplification varies when turning on electricity. Therefore, in fact, a great deal of effort has been made for suppressing the phenomenon over the crystal growth and the device fabrication.

In addition, non-uniformity in crystal growth of substrate is a serious problem for fabricating the above devices. For example, even when a particular region in plane of the substrate surface provides satisfactory characteristics for a device fabricated thereon, the other region in plane thereof frequently provides unsatisfactory characteristics for a device fabricated thereon.

SUMMARY OF THE INVENTION

Therefore, it is an object of the invention to provide a nitride semiconductor free-standing substrate that allows the growth of a uniform nitride semiconductor layer thereon, and to provide a nitride semiconductor light-emitting device and a nitride semiconductor electronic device with excellent characteristics fabricated by using the substrate.

(1) According to one embodiment, a nitride semiconductor free-standing substrate comprises:

a surface inclined in a range of 0.03° to 1.0° from a C-plane, and an off-orientation that an angle defined between a C-axis and a tangent at each point on a whole surface of the substrate becomes maximum is displaced in a range of 0.5° to 16° from a particular M-axis orientation of six-fold symmetry M-axis orientations, wherein the substrate does not include a region of $-0.5°<\phi<+0.5°$ on the surface, where $\phi$ represents a displacement angle of the off-orientation from the particular M-axis orientation.

(2) According to another embodiment, a nitride semiconductor light-emitting device comprises:

a light emitting layer comprising a nitride semiconductor on the nitride semiconductor free-standing substrate device according to the above embodiment (1).

(3) According to another embodiment, a nitride semiconductor electronic device comprises:

an electronic device layer comprising a nitride semiconductor on the nitride semiconductor free-standing substrate device according to the above embodiment (1).

In the above embodiments (1) to (3), the following modifications and changes can be made.

(i) The off-orientation is displaced in a range of 1° to 13° from the particular M-axis orientation.

(ii) The off-orientation is displaced in a range of 2° to 8° from the particular M-axis orientation.

BRIEF DESCRIPTION OF THE DRAWINGS

Next, the present invention will be explained in more detail in conjunction with appended drawings, wherein.

DESCRIPTION OF THE PREFERRED EMBODIMENT

A nitride semiconductor free-standing substrate, a nitride semiconductor light-emitting device and a nitride semiconductor electronic device in the preferred embodiment according to the present invention will be described below.

The inventors keenly examined measures for solving the above problem of the conventional nitride semiconductor device. As a result, as shown FIG. 1, it has been found that the problem of the conventional nitride semiconductor device, where a nitride semiconductor free-standing substrate having a surface inclining at an angle θ of 0.03° to 1.0° (i.e., slight inclination) from a C-plane (a (0001) plane) is used, can be solved by using the nitride semiconductor free-standing substrate having an off-orientation (i.e., an orientation in which an angle defined between a C-axis and a tangent at each point on the whole surface of the substrate becomes maximum) displaced at an angle φ of 0.5° to 16° from an M-axis orientation (i.e., a <11-20> orientation or an orientation equivalent to this) where the substrate does not include a region of −0.5°<φ<+0.5° on the surface, where φ represents a displacement angle of the off-orientation from the M-axis orientation, without using a conventional crystal substrate whose M-axis or A-axis orientation is set to be the off-orientation.

Figure 1:
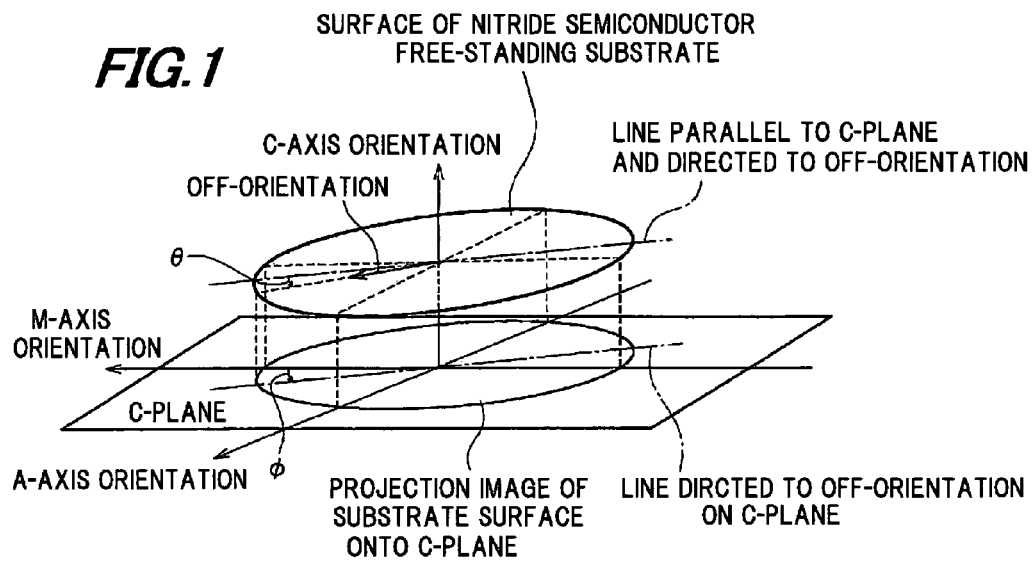
FIG. 1 is an illustration for explaining an inclination angle and an off-orientation on a surface of a nitride semiconductor free-standing substrate in a preferred embodiment according to the present invention.

FIG. 1 shows a particular M-axis orientation, of six orientations of six-fold symmetry M-axis, displaced in the range of 0.5° to 16° from the off-orientation and an A-axis orientation, of six orientations of six-fold symmetry A-axis, normal to the particular. M-axis orientation.

It is found that the displacement of the off-orientation from the M-axis orientation is more preferably in the range of 1° to 13°, and further preferably in the range of 2° to 8°.

Although the above nitride semiconductor free-standing substrate is preferably formed of GaN, it may be, of course, formed of AlGaN, AlN or the like.

By using the above nitride semiconductor free-standing substrate, it is possible to uniformly grow a high-quality nitride semiconductor layer in plane of the substrate, such that a nitride semiconductor light-emitting device and a nitride semiconductor electronic device with excellent characteristics can be produced which have the nitride semiconductor layer on the nitride semiconductor free-standing substrate.

In the above examination, at first, the inventors confirmed that steps on the surface of the crystal grown on the substrate becomes random when the off-orientation is directed to substantially the A-axis orientation, and linearity of the steps is slightly improved when the off-orientation is directed to substantially the M-axis orientation (as reported in X. Q. Shen and H. Okumura, Journal of Crystal Growth, 300 (2007) 75-78).

However, even though the linearity of the steps is improved when the off-orientation is directed to just the M-axis orientation, it was exactly found that the steps significantly meanders in a width of several tens of μm when observing the steps in a wide visual field (e.g., in a region of about 100 μm square). In deal conditions, linear steps in a direction normal to the M-axis orientation should be obtained when the off-orientation is directed to just the M-axis orientation. However, the actual substrate surface has various imperfections such as dislocation, impurities, imperfect flatness of the substrate or the like, so that the linearity of the steps is greatly impaired.

Throughout the above examination, the inventors found that the linearity of the steps can be dramatically improved in the wide visual field (e.g., in a region of about 100 μm square) when the off-orientation is displaced in the range of 0.5° to 16° from the M-axis orientation. When the off-orientation is displaced in the range of 0.5° to 16° from the M-axis orientation, steps normal to the M-axis orientation and steps normal to the A-axis orientation are mixed, so that it is found that a ratio of both steps is determined by displacement of the off-orientation from the M-axis orientation. In this case, although the steps are linear in the wide visual field, they are not linear but zigzag microscopically. Thus, even if the imperfection exists on the substrate surface, it is possible to absorb the imperfection relatively easily and to return the steps to its proper position and direction. Therefore, it is possible to improve the linearity of the steps in the wide visual field.

Although some methods for making a nitride semiconductor free-standing substrate are known, as the result of checking in detail the GaN substrate made by these methods, it is found that the crystal itself is far from perfect, and that the C-plane itself is previously warped in many cases. Therefore, when geometrically flattening the surface of the substrate by polishing or the like, the off-orientation of the substrate surface may be inconstant, or even off-orientation distribution of ±tens of degrees may occur to a particular M-axis. In the case of a substrate having a large off-orientation distribution, a position/region with an off-orientation displacement of −0.5°<φ<+0.5° from the M-axis orientation exists on the substrate surface. When forming a device on such substrate, the characteristics of the device in the position/region with the off-orientation displacement of −0.5°<φ<+0.5° from the M-axis orientation remarkably deteriorate. Therefore, in this embodiment, the nitride semiconductor free-standing substrate is controlled not to include a region with the off-orientation displacement of −0.5°<φ<+0.5° from the M-axis orientation on the substrate surface.

As a nitride semiconductor free-standing substrate, a GaN free-standing substrate made by using the void-assisted separation (VAS) method reported by Mr. Oshima et al., (Yuichi Oshima et al., Japanese Journal of Applied Physics, Vol. 42 (2003) pp. L1-L3) is preferable. The GaN free-standing substrate is made by the VAS method such that, at first, a GaN film and a Ti film are formed on a sapphire substrate, the sapphire substrate with the GaN film and the Ti film formed thereon is heated such that a number of voids (air pores) are formed in the GaN thin film and the Ti film is formed into TiN film (i.e., TiN nano mask) having a network structure, a GaN thick film is formed on the GaN film with the voids, and the GaN thick film is separated from the sapphire substrate to have a GaN free-standing substrate. The GaN free-standing substrate thus made by the VAS method has low dislocation density, high in-plane uniformity and less warping.

Although the nitride semiconductor free-standing substrates made by various methods may often have various dispersion in the off-orientation, by suitably selecting the off-orientation (i.e., an inclination orientation formed by polishing etc.) at a central position of the substrate, a substrate can be made such that orientation (i.e., off-orientation) in which an angle between a C-axis and a tangent on the surface throughout the whole surface of the substrate becomes maximum is in the range of 0.5° to 16° from the M-axis orientation, and that the substrate surface does not include a region with the off-orientation displacement of −0.5°<φ<+0.5° from the M-axis orientation.

In fabricating a light emitting device using the above nitride semiconductor free-standing substrate, InGaN is generally used for a light emitting layer of the light emitting device. Emission wavelength distribution of the light emitting layer is dominated by distribution of In composition in the InGaN layer. When the InGaN layer is grown on a nitride semiconductor having steps with linearity improved as described above, indium atoms are uniformly incorporated into the steps such that the InGaN layer can have uniform in-plane composition. As a result, the emission wavelength distribution of the light emitting layer is narrowed compared to the conventional light emitting layer such that the characteristics of the light emitting device such as a light emitting diode and a laser diode can be improved thereby.

Also, it is possible to significantly suppress the current collapse of HEMT that is fabricated by growing a nitride semiconductor layer having a HEMT structure on the above nitride semiconductor free-standing substrate. Although the cause of the current collapse is not yet identified, it is assumed that defects in an AlGaN layer as a carrier supply layer are involved. Similarly to the case of InGaN, it is assumed that Al composition becomes nonuniform when growing AlGaN on a conventional nitride semiconductor with fluctuating steps on the surface. As a result, even when growth conditions are varied for reducing the defects in the AlGaN layer, defects must be generated in the AlGaN layer of a region having a Al component while defects in the AlGaN layer of another region having another Al composition may be reduced. Therefore it appears that it is not possible to eliminate the defects from the entire AlGaN layer in any case. In case of using a nitride semiconductor free-standing substrate of the embodiment and growing AlGaN on a nitride semiconductor having surface steps with high linearity, similarly to the case of InGaN, an AlGaN layer with high uniformity in Al composition can be obtained. Thus, it is possible to effectively reduce defects in the entire AlGaN layer by suitably selecting the growth condition of AlGaN.

EXAMPLES

Examples of the invention will be explained below.

Example 1

In Example 1, a GaN free-standing substrate formed by the VAS method is used as a nitride semiconductor free-standing substrate. A method for making a GaN free-standing substrate by the VAS method will be explained in conjunction with FIG. 2.

Figure 2A:
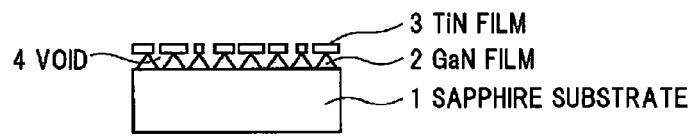
FIGS. 2A to 2C are diagrams showing fabrication steps of a GaN free-standing substrate made in Example.

At first, a Ti film as a metal film is formed by vapor deposition on a structure of a GaN film/sapphire substrate with a GaN thin film 2 formed on a sapphire substrate 1 by MOVPE (metal organic vapor phase epitaxy), and a number of voids 4 are formed in the vicinity of the Ti/GaN interface by subsequent heat treatment in an electric furnace so that the Ti film is formed into a network TiN film (TiN nano mask) 3 (FIG. 2A).

Figure 2B:
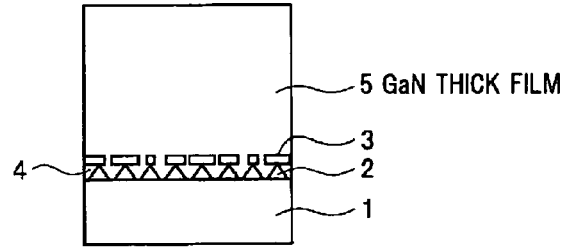

Then, a GaN thick film 5 is grown to 300 μm or more in thickness by HVPE (hydride vapor phase epitaxy) on the GaN thin film 2 with the voids 4 (FIG. 2B).

Figure 2C:
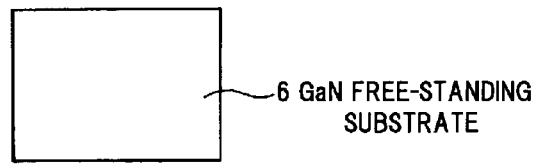

After the growth, the GaN thick film 5 is mechanically separated from the substrate by determining the TiN film 3 as the boundary, so that a GaN free-standing substrate 6 can be obtained as the GaN thick film 5 thus separated (FIG. 2C).

Figure 3:
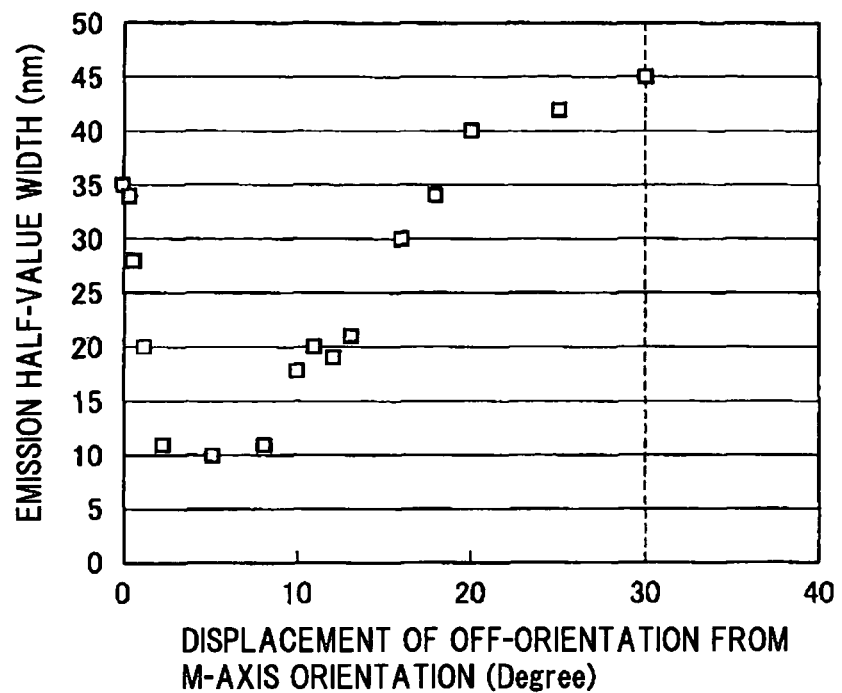
FIG. 3 is a graph showing relationships between a displacement of an off-orientation of a substrate surface and an emission half-value width of photoluminescence (PL) at a central position of the GaN free-standing substrate in Example.

By grinding and polishing the front and back surfaces of the GaN free-standing substrate 6 thus obtained, plural GaN free-standing substrates having various directions are made which are inclined at 0.3° from the C-plane at a central position of the substrate surface and the off-orientation is in the range of 30° from the M-axis orientation to the A-axis orientation (e.g., displacement angles of the off-orientation from the M-axis orientation are 0°, 0.3°, 0.5°, 1°, 2°, 5°, 8°, 10°, 11°, 12°, 13°, 16°, 18°, 20°, 25° and 30°) (See FIG. 3).

An InGaN/GaN multiquantum well (MQW) is grown on these GaN free-standing substrates by MOVPE. A growth process thereof is as follows. The GaN free-standing substrate is placed in a MOVPE apparatus, and a Si doped GaN layer of $5\times10^{18}$ cm$^{-3}$ in electron concentration is grown to 4 μm in a mixed gas atmosphere of hydrogen and nitrogen (40 slm of hydrogen and 40 slm of nitrogen) at about 101325 Pa (760 Torr), using 20 slm of ammonia gas as a nitrogen source, at substrate temperature of 1075° C. Then, the substrate temperature is lowered to 750° C. and a 6-period InGaN/GaN multiquantum well structure is formed. Indium (In) composition is adjusted to have a peak emission wavelength at 460 nm n.

FIG. 3 shows a relationship between the off-orientation and an emission half-value width of photoluminescence (PL) at a central position of the GaN free-standing substrate. PL measurement is conducted using a He—Cd laser at room temperature. The intensity of exciting light is 5/Wcm$^2$.

As shown in FIG. 3, the emission half-value width is 35 nm when the off-orientation is the M-axis orientation (i.e., displacement of the off-orientation from the M-axis orientation is 0°), and 45 nm when the off-orientation is the A-axis orientation (i.e., displacement of the off-orientation from the M-axis orientation is 30°). When displacement of the off-orientation from the M-axis orientation is not more than 0.3°, or, not less than 18°, the emission half-value width is about 35 nm or more, which is the same as the case that the off-orientation is just the M-axis orientation, or rather, the half-value width becomes larger than that.

On the other hand, when displacement of the off-orientation from the M-axis orientation is in the range of 0.5° to 16°, the emission half-value width is as narrow as 30 nm or less. Furthermore, when displacement of the off-orientation from the M-axis orientation is in the range of 1° to 13°, the emission half-value width is very narrow, about 20 nm or less. Furthermore, a further remarkable improvement is obtained when displacement of the off-orientation from the M-axis orientation is in the range of 2° to 8°, the emission half-value width is extremely narrow, about 10 nm, whereby emission with very high color purity can be obtained.

To analyze the cause of the half-value width improvement, a sample is prepared in which only a Si doped GaN layer is grown on the substrate by the same method as the above, and the state of steps on the surface is observed by an atomic force microscope. When displacement of the off-orientation from the M-axis orientation is not more than 0.3°, steps with high linearity are observed when viewed in the range of several μm, however, highly meandering steps are observed when viewed in the wide range of about several hundredths of μm. When displacement of the off-orientation from the M-axis orientation is not less than 18°, steps highly meanders even when viewed in the range of several μm.

In contrast, when displacement of the off-orientation from the M-axis orientation is in the range of 0.5° to 16°, occurrence of meandering steps is suppressed. It is found that the improvement of the meandering steps becomes maximum when displacement of the off-orientation from the M-axis orientation is in the range of 2° to 8°.

As described above, a significant correlation is confirmed between degree of meandering of the steps and the emission half-value width. Thus, it is assumed that, when growing a crystal of InGaN as a light emitting layer on the surface, the emission half-value width becomes narrow since the indium atoms are uniformly incorporated into the steps according as linearity of the step is increased so that an InGaN layer with uniform In composition can be obtained.

Further, measurement of the emission half-value width similar to the above is conducted to the whole surface of the substrate.

Although each substrate has various dispersions in off-orientation, by suitably selecting the off-orientation at the central position of the substrate, a substrate can be made that an orientation (i.e., off-orientation) in which an angle between C-axis and a tangent throughout the whole substrate surface becomes maximum is in the range of 0.5° to 16° from the M-axis orientation, and that does not include a region with an off-orientation displacement of $-0.5°<\phi<+0.5°$ from the M-axis orientation on the substrate surface.

For example, when the substrate surface includes a region with the off-orientation displacement of $-0.5°<\phi<+0.5°$ from the M-axis orientation, the emission half-value width has a wide distribution of about 10 nm to 35 nm. However, when the substrate surface does not include a region with the off-orientation displacement of $-0.5°<\phi<+0.5°$ from the M-axis orientation, the emission half-value width can be improved so that it is about 20 nm or less, or, about 10 nm throughout the whole substrate surface.

Example 2

GaN free-standing substrates are made that inclination from the C-plane of the surface thereof is varied in the range of 0° to 2°, and the same experiment as Example 1 is conducted. As a result, in the range of 0.03° to 1.0° of the inclination from the C-plane of the substrate surface, the same result as Example 1 is obtained.

In contrast, when inclination from the C-plane of the substrate surface is less than 0.03° or more than 1.0°, significant off-orientation dependency is not found in the emission half-value width. When inclination from the C-plane of the substrate surface is less than 0.03°, it is assumed that off-orientation in plane is not fully controlled due to a problem in processing accuracy of the surface, so that intended off-orientation cannot be controlled. When inclination from the C-plane of the substrate surface is more than 1.0°, steps on the surface are not unimolecular steps but multistage steps and the number of steps thereof cannot be controlled only by the off-orientation. In this case, it is assumed that fluctuation in the number of steps is a dominant factor of the emission half-value width and, therefore, clear off-orientation dependency is not found in the emission half-value width.

Example 3

A GaN free-standing substrate as in Example 1 is made and a nitride semiconductor layer having a blue-violet laser diode structure is formed on the substrate by MOVPE.

At first, a Si doped n-GaN layer is grown on the GaN free-standing substrate and an n-AlGaN/GaN short-period superlattice structure is formed thereon. A 3-period InGaN/GaN multiquantum well light emitting layer is further formed thereon via an n-GaN layer. Then, a p-AlGaN/p-GaN layer, a p-AlGaN/GaN short-period superlattice structure and a p-GaN contact layer are sequentially formed thereon.

Figure 4:
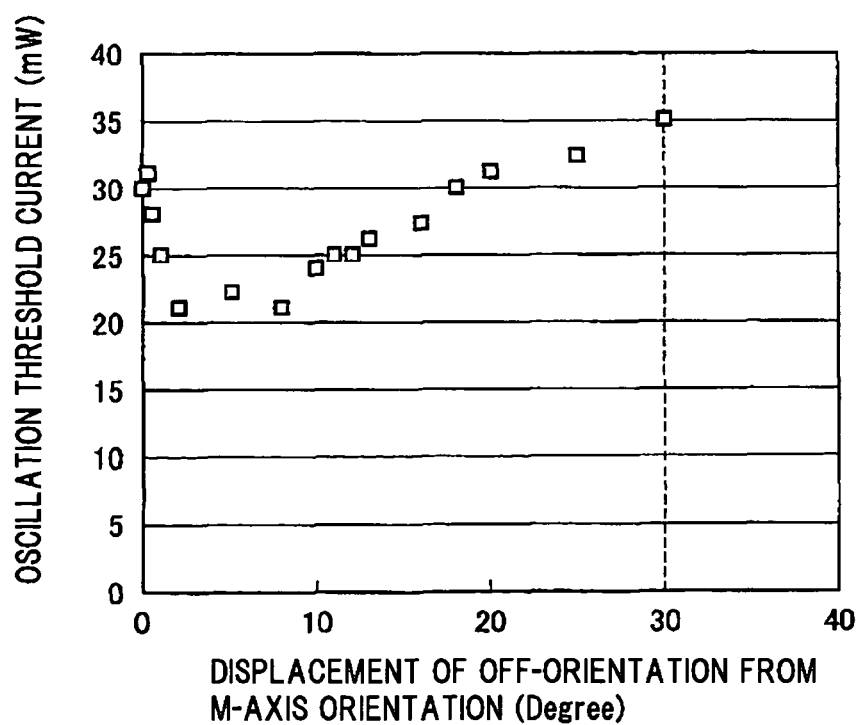
FIG. 4 is a graph showing relationships between a displacement of an off-orientation of a substrate surface from an M-axis orientation and an oscillation threshold current of a laser diode in Example.

A laser device with a ridge width of 5 μm and a resonator length of 400 μm is made by using this epitaxial substrate and characteristics of the laser device are evaluated. FIG. 4 shows displacement angle dependency of the off-orientation from the M-axis of the oscillation threshold current of the laser device thus fabricated.

In Example 3, similarly to the previous Examples, it is confirmed that the characteristics are improved and the oscillation threshold current decreases according as the linearity of steps on the surface of the GaN free-standing substrate as a base is improved. Concretely, when the off-orientation is directed to just the M-axis, the oscillation threshold current is 30 mA. However, when displacement of the off-orientation from the M-axis orientation is in the range of 0.5° to 16°, the oscillation threshold current is less than 30 mA. Especially, when displacement of the off-orientation from the M-axis orientation is in the range of 2° to 8°, the oscillation threshold current is minimum and is extremely low, about 21-22 mA.

Further, when using a substrate whose surface does not include a region with the off-orientation displacement of $-0.5°<\phi<+0.5°$ from the M-axis orientation, the oscillation threshold current can be about 20 mA throughout the whole surface of the substrate.

Example 4

A GaN free-standing substrate as in Example 1 is made and a HEMT structure is formed by growing sequentially an undoped GaN layer and a Si doped AlGaN layer thereon.

Figure 5:
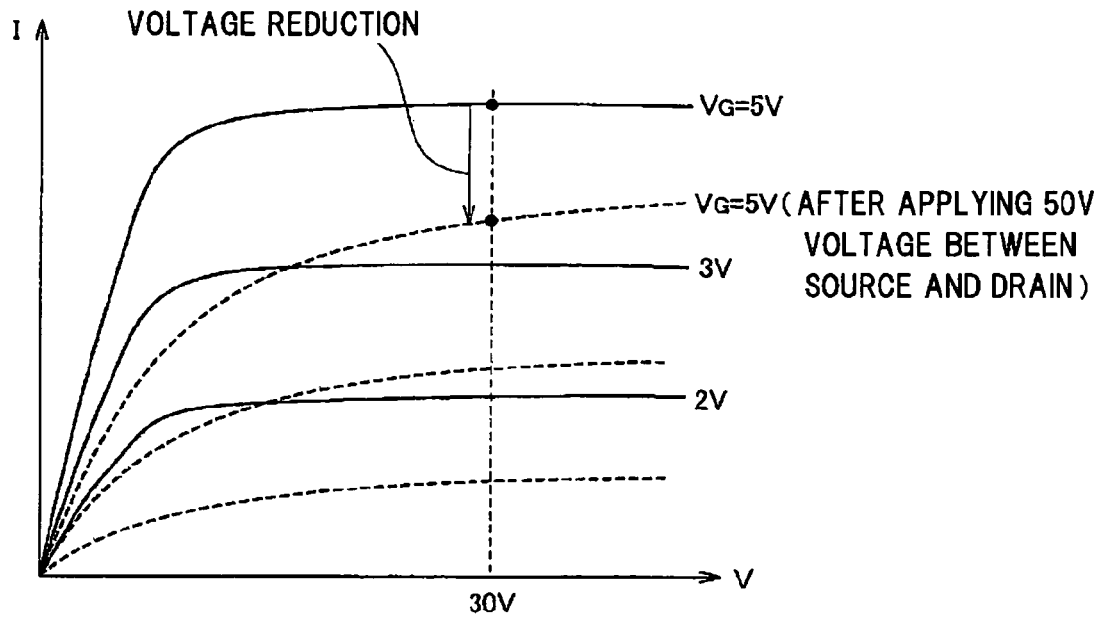
FIG. 5 is a graph illustratively showing a current-voltage characteristic of an HEMT in Example.

Source, drain and gate electrodes are formed on the HEMT structure to have a device, and characteristics thereof are evaluated. FIG. 5 schematically shows a current-voltage characteristic between the source and the drain. After about 50V of voltage is applied between the source and the drain, so-called "current collapse" phenomenon is observed, i.e., current flowing through the device decreases (e.g., current-voltage characteristics indicated by a full line in FIG. 5 are changed into current-voltage characteristics indicated by a broken line after applying 50V of voltage).

Figure 6:
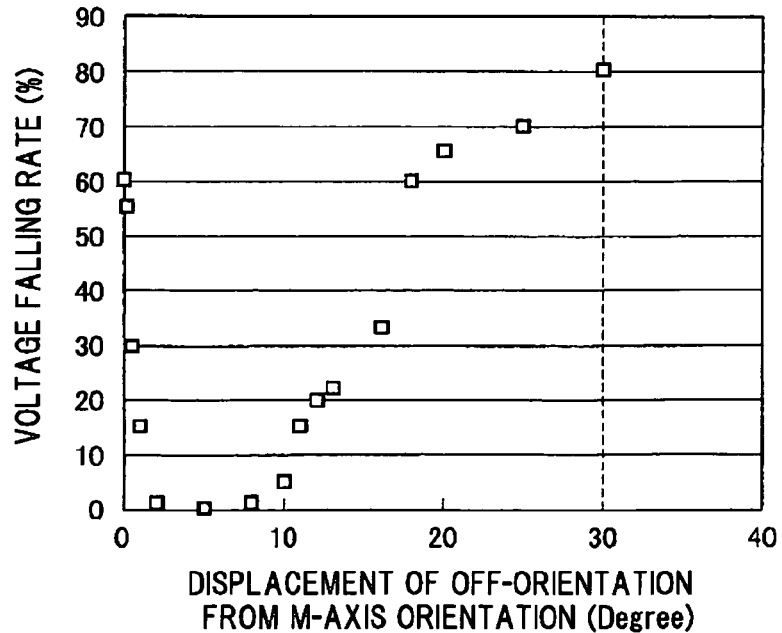
FIG. 6 is a graph showing relationships between a voltage falling rate of an HEMT in Example and an off-orientation (i.e., its displacement from an M-axis orientation) of a GaN free-standing substrate on which the HEMT structure is formed.

FIG. 6 shows a falling rate of current (I) plotted to off-orientation (displacement from the M-axis orientation) of the GaN free-standing substrate with the HEMT structure formed thereon, where gate voltage $V_G$ is 5V and voltage V between the source and the drain is 30V in FIG. 5.

In Example 4, similarly to the previous Examples, it is confirmed that the characteristics are improved and the current reduction is suppressed according as the linearity of steps on the surface of the GaN free-standing substrate as a base is improve. Concretely, when the off-orientation is directed to just the M-axis, the current falling rate is 60%. However, when displacement of the off-orientation from the M-axis orientation is in the range of 0.5° to 16°, the current falling rate can be reduced to about 30%. Especially, when the displacement of the off-orientation from the M-axis orientation is in the range of 2° to 8°, it is confirmed that the current reduction occurs scarcely so that the current collapse can be almost completely suppressed.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A nitride semiconductor free-standing substrate, comprising:
   a surface inclined in a range of 0.03° to 1.0° from a C-plane,
   wherein an off-orientation that an angle defined between a C-axis and a tangent at each point on a whole surface of the substrate becomes maximum is displaced in a range of 0.5° to 16° from a particular M-axis orientation of six-fold symmetry M-axis orientations, and
   wherein the substrate does not include a region of $-0.5° < \phi < +0.5°$ on the surface, where $\phi$ represents a displacement angle of the off-orientation from the particular M-axis orientation.

2. The nitride semiconductor free-standing substrate according to claim 1, wherein the off-orientation is displaced in a range of 1° to 13° from the particular M-axis orientation.

3. The nitride semiconductor free-standing substrate according to claim 1, wherein the off orientation is displaced in a range of 2° to 8° from the particular M-axis orientation.

4. A nitride semiconductor light-emitting device, comprising:
   a light emitting layer comprising a nitride semiconductor on the nitride semiconductor free-standing substrate device according to claim 1.

5. The light-emitting device according to claim 4, wherein the light emitting layer comprises InGaN.

6. The light-emitting device according to claim 4, wherein the light emitting device comprises a light emitting diode.

7. The light-emitting device according to claim 4, wherein the light-emitting device comprises a laser device.

8. The light-emitting device according to claim 7, wherein an oscillation threshold current is between 20 mA and 30 mA.

9. A nitride semiconductor electronic device, comprising;
   an electronic device layer comprising a nitride semiconductor on the nitride semiconductor free-standing substrate device according to claim 1.

10. The nitride semiconductor free-standing substrate according to claim 1, wherein said surface comprises a GaN surface.

11. The nitride semiconductor free-standing substrate according to claim 1, wherein the surface comprises a polished surface.

12. The nitride semiconductor free-standing substrate according to claim 1, wherein first steps, on a surface of a crystal grown on the substrate, normal to the M-axis orientation and second steps, on the surface of the crystal grown on the substrate, normal to the A-axis orientation have a zigzag shape microscopically.

13. The nitride semiconductor free-standing substrate according to claim 1, wherein an emission half-value width of photoluminescence at a central position of the substrate is 30 nm or less.

14. The nitride semiconductor free-standing substrate according to claim 1, wherein an emission half-value width of photoluminescence at a central position of the substrate is 10 nm or less.

15. The nitride semiconductor free-standing substrate according to claim 1, wherein a current falling rate is about half of a current falling rate when the off-orientation is directed to the particular M-axis orientation.

* * * * *